(12) United States Patent
Nakahashi

(10) Patent No.: US 10,615,770 B2
(45) Date of Patent: Apr. 7, 2020

(54) LADDER FILTER

(71) Applicant: Murata Manufacturing Co., Ltd., Nagaokakyo-shi, Kyoto-fu (JP)

(72) Inventor: Norihiko Nakahashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/363,058

(22) Filed: Mar. 25, 2019

(65) Prior Publication Data

US 2019/0222192 A1 Jul. 18, 2019

Related U.S. Application Data

(63) Continuation of application No. PCT/JP2017/027313, filed on Jul. 27, 2017.

(30) Foreign Application Priority Data

Sep. 28, 2016 (JP) ................. 2016-189983

(51) Int. Cl.
  *H03H 9/64* (2006.01)
  *H03H 9/00* (2006.01)
  *H03H 9/52* (2006.01)
  *H03H 9/54* (2006.01)
  *H03H 9/13* (2006.01)

(52) U.S. Cl.
  CPC ............ *H03H 9/0004* (2013.01); *H03H 9/52* (2013.01); *H03H 9/54* (2013.01); *H03H 9/64* (2013.01); *H03H 9/132* (2013.01)

(58) Field of Classification Search
  CPC .......... H03H 9/0004; H03H 9/64; H03H 9/54; H03H 9/52; H03H 9/132; H03H 9/725; H03H 9/706

USPC .......................... 333/133, 187, 188, 193–196
See application file for complete search history.

(56) References Cited

U.S. PATENT DOCUMENTS

2004/0257172 A1\* 12/2004 Schmidhammer ... H03H 9/0038
                                                                    333/133
2007/0290767 A1   12/2007 Ali-Ahmad et al.
2009/0009263 A1   1/2009  Javid et al.
(Continued)

FOREIGN PATENT DOCUMENTS

JP      06-69750 A      3/1994
JP      10-13187 A      1/1998
JP      2011-114826 A   6/2011
(Continued)

OTHER PUBLICATIONS

Official Communication issued in International Patent Application No. PCT/JP2017/027313, dated Oct. 10, 2017.

*Primary Examiner* — Robert J Pascal
*Assistant Examiner* — Jorge L Salazar, Jr.
(74) *Attorney, Agent, or Firm* — Keating & Bennett, LLP

(57) ABSTRACT

A ladder filter includes serial arm resonators disposed along a serial arm and parallel arm resonators disposed along corresponding parallel arms. Ladder circuit units are disposed along a path from an input terminal, which is a first end, to an output terminal, which is a second end. Each of the ladder circuit units includes a single serial arm resonator and a single parallel arm resonator. The ladder circuit units are mirror-connected to one another. The impedance at the first end is different from the impedance at the second end.

15 Claims, 3 Drawing Sheets

(56) References Cited

U.S. PATENT DOCUMENTS

2011/0248794 A1* 10/2011 Klamm ................ H03H 9/725
 333/133
2012/0274421 A1 11/2012 Hara et al.

FOREIGN PATENT DOCUMENTS

KR 10-2007-0106545 A 11/2007
WO 2011/065199 A1 6/2011

* cited by examiner

LADDER FILTER

CROSS REFERENCE TO RELATED APPLICATIONS

This application claims the benefit of priority to Japanese Patent Application No. 2016-189983 filed on Sep. 28, 2016 and is a Continuation Application of PCT Application No. PCT/JP2017/027313 filed on Jul. 27, 2017. The entire contents of each application are hereby incorporated herein by reference.

BACKGROUND OF THE INVENTION

1. Field of the Invention

The present invention relates to a ladder filter including multiple serial arm resonators and multiple parallel arm resonators.

2. Description of the Related Art

Ladder filters have been used widely as band pass filters in RF stages of cellular phones. Ladder filters may achieve reduction in the loss and use in a higher frequency band. In addition, ladder filters may increase attenuation near the pass band.

In the ladder filter described in a PCT Publication WO 2011/065199 A1, multiple stages of ladder circuit units are connected to one another. Each ladder circuit unit includes a single serial arm resonator and a single parallel arm resonator. To reduce reflection between adjacent ladder circuit units, one of the adjacent ladder circuit units is connected to the other in a mirror-reversed manner.

In a band pass filter such as a ladder filter, the impedance of the input terminal and the impedance of the output terminal are typically set to 50Ω.

On the other hand, in a radio frequency circuit used in an RF stage or the like or other suitable structure of a cellular phone, a component, such as an amplifying device, a switch, or an LNA, is connected to a ladder filter. The impedance of such peripheral a component is sometimes not 50Ω. Therefore, to achieve impedance matching in such a peripheral component, an impedance matching circuit needs to be provided. An impedance matching circuit is a circuit that typically includes an inductor and a capacitor, and is generally a circuit having includes two devices or three devices. Accordingly, a large loss due to the impedance matching circuit is incurred. In addition, there arises a problem that the footprint is made large.

SUMMARY OF THE INVENTION

Preferred embodiments of the present invention provide ladder filters each of which may reduce a number of impedance matching devices, thus enabling a reduction or prevention of an increase in the loss due to the impedance matching devices and enabling the footprint to be small.

A ladder filter according to a preferred embodiment of the present invention includes a serial arm and a plurality of parallel arms. The serial arm connects a first end to a second end. The plurality of parallel arms are connected between the serial arm and a ground potential. The ladder filter includes a plurality of serial arm resonators disposed along the serial arm and a plurality of parallel arm resonators disposed along the respective parallel arms. Ladder circuit units whose number is n (n is an integer of two or more, hereinafter "n ladder circuit units") are disposed from the first end to the second end. Each of the n ladder circuit units includes a corresponding one of the serial arm resonators and a corresponding one of the parallel arm resonators. The n ladder circuit units are mirror-connected to one another. An impedance at the first end is different from an impedance at the second end.

In a ladder filter according to a preferred embodiment of the present invention, in the n ladder circuit units, when impedances of adjacent ladder circuit units are Xa and Xb, the adjacent ladder circuit units being mirror-connected to one another, and when the ladder circuit unit with the impedance Xa is positioned on the first end side relative to the ladder circuit unit with the impedance Xb, Xa≤Xb or Xa≥Xb, in which not all impedances of all of the ladder circuit units are equal or substantially equal to one another.

In a ladder filter according to a preferred embodiment of the present invention, when the impedances of the n ladder circuit units are Xa, Xb, Xc, . . . , Xn from the first end side to the second end side, Xa≤Xb≤Xc≤ . . . ≤Xn or Xa≥Xb≥Xc≥ . . . ≥Xn is satisfied, but Xa=Xb=Xc= . . . =Xn is not satisfied.

In a ladder filter according to a preferred embodiment of the present invention, an inductor that is connected between at least one of ends and the ground potential is included. The ends are the first end and the second end.

In a ladder filter according to a preferred embodiment of the present invention, the impedance at the first end or the second end is preferably about 50Ω.

In a ladder filter according to a preferred embodiment of the present invention, the serial arm resonators and the parallel arm resonators are defined by elastic wave resonators.

Preferred embodiments of the present invention may provide ladder filters which may reduce the number of impedance matching devices, thus decreasing the loss and decreasing the footprint.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
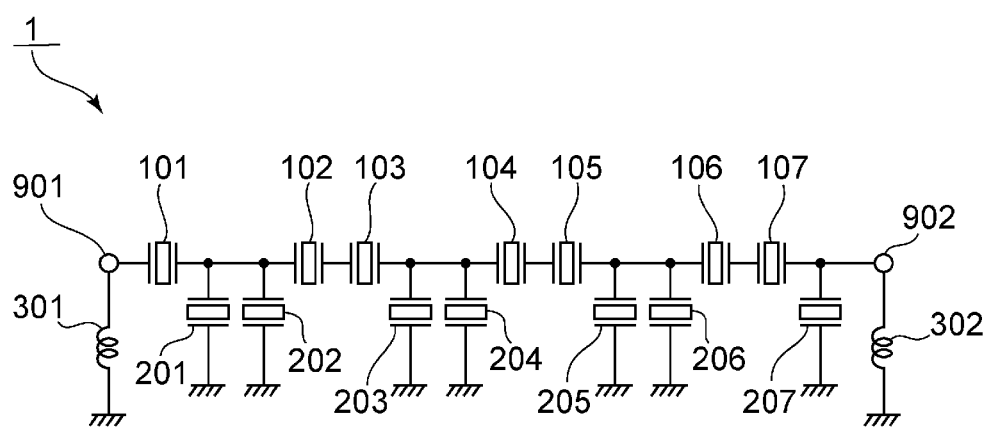
FIG. 1 is a circuit diagram illustrating a ladder filter according to a preferred embodiment of the present invention.

Referring to the drawings, specific preferred embodiments of the present invention will be described below so as to clarify the present invention.

It is noted that the preferred embodiments described herein are exemplary, and that some components in different preferred embodiments may be replaced or combined with one another.

FIG. 1 is a circuit diagram of a ladder filter according to a preferred embodiment of the present invention.

A ladder filter 1 includes an input terminal 901 defining and functioning as a first end and an output terminal 902 defining and functioning as a second end. Multiple serial arm resonators 101 to 107 are disposed along a serial arm connecting the input terminal 901 to the output terminal 902. A single parallel arm resonator is disposed along each of the multiple parallel arms connecting the serial arm to the ground potential. In FIG. 1, parallel arm resonators 201 to 207 are disposed along the seven respective parallel arms.

An inductor 301 defining and functioning as an impedance matching device is connected between the input terminal 901 and the ground potential. An inductor 302 defining and functioning as an impedance matching device is connected also between the output terminal 902 and the ground potential.

The ladder filter 1 includes seven stages of ladder circuit units each including one serial arm resonator and one parallel arm resonator. For example, the first-stage ladder circuit unit includes the serial arm resonator 101 and the parallel arm resonator 201. The second-stage ladder circuit unit includes the parallel arm resonator 202 and the serial arm resonator 102. In the portion in which the first-stage and second-stage ladder circuit units are adjacent to each other, the first-stage ladder circuit unit includes a mirror-reversed configuration with respect to that of the second-stage ladder circuit unit. Thus, the connection configuration, in which one of adjacent ladder circuit units includes a mirror-reversed configuration with respect to that of the other ladder circuit unit, is called mirror connection. In the ladder filter 1, for example, seven stages of ladder circuit units are preferably mirror-connected to one another.

The reason why mirror connection is used as described above is to reduce or prevent reflection between ladder circuit units, as described in the PCT publication WO 2011/065199 A1.

A feature of the ladder filter 1 according to the present preferred embodiment is that the impedance at the input terminal 901, defining and functioning as a first end, is different from the impedance at the output terminal 902 defining and functioning as the second end. As described above, the impedance at the input terminal and the impedance at the output terminal have been typically set to, for example, about 50Ω in a band pass filter, such as a ladder filter. Therefore, when the impedance of a peripheral component that is to be connected is different from, for example, about 50Ω, an impedance matching circuit including two devices or three devices needs to be used to achieve impedance matching.

In contrast, in the ladder filter 1, the impedance at the input terminal 901 is preferably different from the impedance at the output terminal 902, that is, not all of the impedances are set to, for example, about 50Ω. Therefore, the ladder filter 1 may reduce the impedance difference from the impedance of a peripheral component. Consequently, the ladder filter 1 may reduce the number of impedance matching devices in an impedance matching circuit. Accordingly, an impedance matching circuit, which is not always necessary, including a single inductor 301 is provided on the input terminal 901 side. Similarly, an impedance matching circuit, which is not always necessary, including a single inductor 302 is also provided on the output terminal 902 side.

As described above, the number of impedance matching devices necessary for an impedance matching circuit may be reduced, and thus, a reduction or prevention of an increase of the loss due to an impedance matching circuit is achieved. In addition, since the size of the impedance matching circuit is decreased, the footprint of the ladder filter 1 may be also decreased.

Preferably, in a ladder filter including ladder circuit units whose number is n (n is an integer of two or more), in the case in which the impedances of adjacent ladder circuit units are Xa and Xb, and where the ladder circuit unit of the impedance Xa is positioned on the first end side relative to the ladder circuit unit of the impedance Xb, $Xa \leq Xb$ or $Xa \geq Xb$, for example, is preferably satisfied. In this case, the impedances of all of the ladder circuit units are not the same or substantially same. In the case of this preferable configuration, in the ladder filter 1, the impedance preferably remains the same or substantially same, or the impedance decreases sequentially along the path from the first end, that is, the input terminal 901 side, to the output terminal 902 side. Alternatively, the impedance preferably remains the same or substantially same, or the impedance increases sequentially. Therefore, the impedance difference between the stages may be reduced. Accordingly, the loss may be further decreased.

The preferable configuration described above is expressed in another representation as follows: when the impedances of ladder circuit units, whose number is n, are Xa, Xb, Xc, ..., Xn from the first end side to the second end side, for example, $Xa \leq Xb \leq Xc \leq \ldots \leq Xn$ or $Xa \geq Xb \geq Xc \geq \ldots \geq Xn$ is preferably satisfied, but $Xa = Xb = Xc = \ldots = Xn$ is not satisfied.

The physical structure of the serial arm resonators 101 to 107 and the parallel arm resonators 201 to 207 described above is not particularly limiting. However, preferably, the serial arm resonators 101 to 107 and the parallel arm resonators 201 to 207 are defined by elastic wave resonators.

While achieving impedance matching, the ladder filter 1 may reduce the number of impedance matching devices and thus reduce the loss. This will be specifically described with reference to an example of a preferred embodiment and a comparative example, which are described below.

A ladder filter 1 defining and functioning as a band pass filter for Band 41 was manufactured as an example of the above-described preferred embodiment.

The design parameters of the serial arm resonators 101 to 107 and the parallel arm resonators 201 to 207 are illustrated in Table 1 described below.

TABLE 1

|  | Serial arm resonator 101 | Parallel arm resonator 201 | Parallel arm resonator 202 | Serial arm resonator 102 | Serial arm resonator 103 | Parallel arm resonator 203 | Parallel arm resonator 204 |
| --- | --- | --- | --- | --- | --- | --- | --- |
| Log of IDT electrode | 118 | 63 | 60 | 135 | 128 | 47 | 44 |

TABLE 1-continued

| | | | | | | | |
|---|---|---|---|---|---|---|---|
| fingers | | | | | | | |
| Intersecting width (μm) | 20 | 20 | 20 | 20 | 20 | 20 | 20 |
| Duty | 0.6 | 0.6 | 0.6 | 0.6 | 0.6 | 0.6 | 0.6 |
| Wavelength (μm) | 1.458 | 1.551 | 1.551 | 1.471 | 1.471 | 1.537 | 1.537 |

| | Serial arm resonator 104 | Serial arm resonator 105 | Parallel arm resonator 205 | Parallel arm resonator 206 | Serial arm resonator 106 | Serial arm resonator 107 | Parallel arm resonator 207 |
|---|---|---|---|---|---|---|---|
| Log of IDT electrode fingers | 122 | 114 | 52 | 49 | 95 | 89 | 64 |
| Intersecting width (μm) | 20 | 20 | 20 | 20 | 20 | 20 | 20 |
| Duty | 0.6 | 0.6 | 0.6 | 0.6 | 0.5 | 0.6 | 0.6 |
| Wavelength (μm) | 1.471 | 1.471 | 1.54 | 1.54 | 1.459 | 1.459 | 1.554 |

In the example of a preferred embodiment described above, seven stages of ladder circuit units are mirror-connected to one another as described above. Therefore, for example, when it is assumed that the impedances of the ladder circuit units are X1, X2, X3, . . . , X7 from the input terminal 901 side to the output terminal 902 side, the impedances of the ladder circuit units are preferably configured so that $X1 \leq X2 \leq X3 \leq \ldots \leq X7$ is satisfied, but $X1=X2=X3= \ldots =X7$ is not satisfied.

A ladder filter as the comparative example in which seven stages of ladder circuit units are mirror-connected to one another similarly to the above-described example of a preferred embodiment was prepared. However, in the ladder filter of the comparative example, the impedances of the stages are equal or substantially equal to one another. In the example of a preferred embodiment described above, the inductance of the inductor 301 and the inductance of the inductor 302 are preferably set to about 5 nH, for example. In the comparative example, the inductances of the inductors connected between the input and output terminals and the ground potential are set to about 5 nH, for example.

Figure 2:
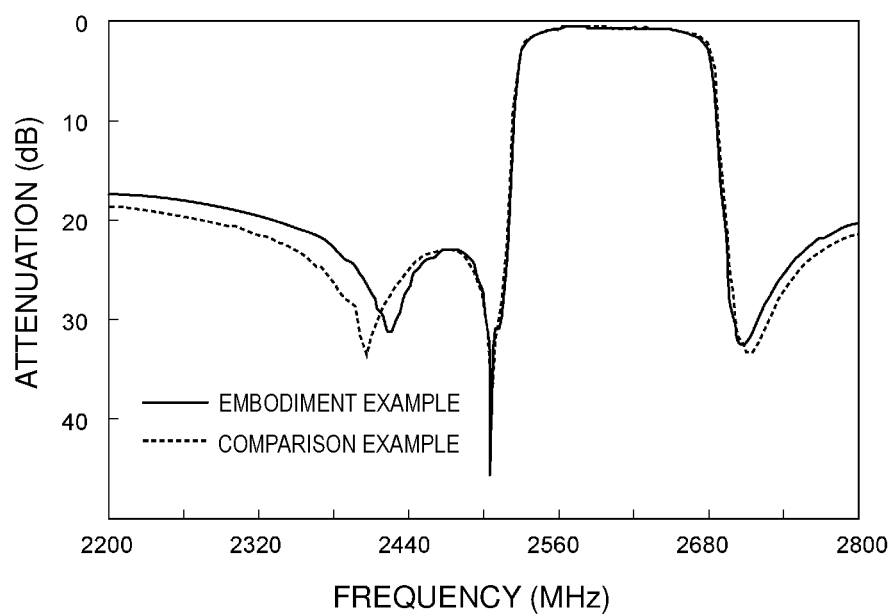
FIG. 2 is a diagram illustrating bandpass characteristics of ladder filters of an example of a preferred embodiment of the present invention and a comparative example.

FIG. 2 is a diagram illustrating bandpass characteristics of the ladder filters of the example of a preferred embodiment and the comparative example described above. The solid line indicates the results of the example of a preferred embodiment. The broken line indicates the result of the comparative example.

As is clear from FIG. 2, the bandpass characteristics of the example of a preferred embodiment in the pass band between about 2545 MHz and about 2655 MHz are equivalent or substantially equivalent to those of the comparative example.

Figure 3:
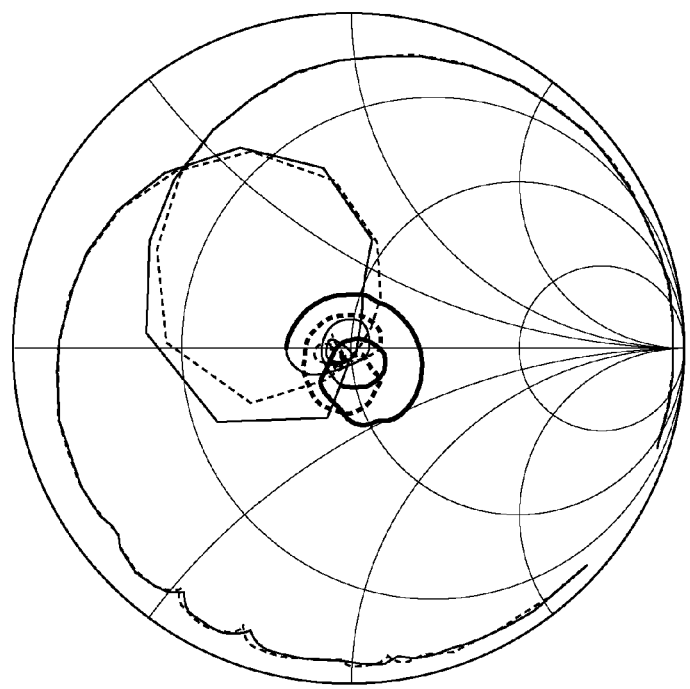
FIG. 3 is an impedance Smith chart on the input terminal side defining and functioning as first ends of ladder filters of an example of a preferred embodiment of the present invention and a comparative example.
Figure 4:
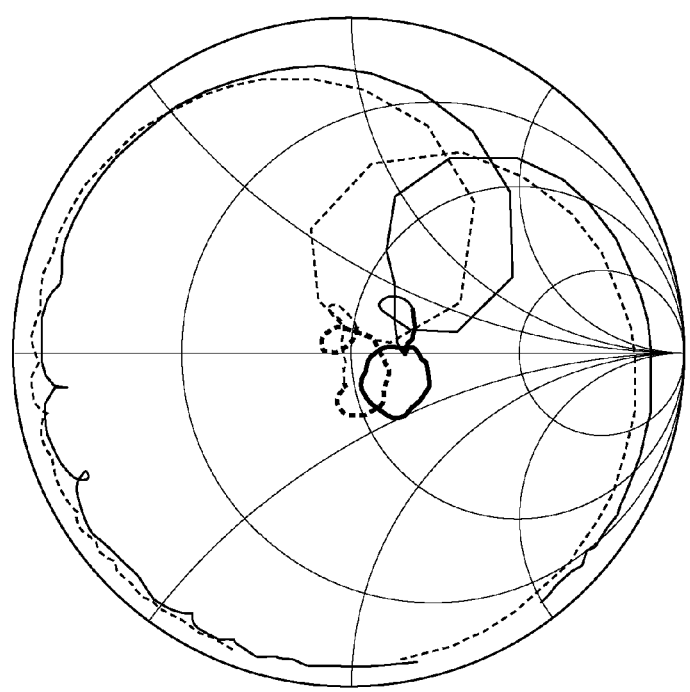
FIG. 4 is an impedance Smith chart on the output terminal side defining and functioning as second ends of ladder filters of an example of a preferred embodiment of the present invention and a comparative example.

FIGS. 3 and 4 illustrate an impedance Smith chart on the input terminal side defining and functioning as the first ends of the ladder filters of the example of a preferred embodiment and the comparative example described above, and an impedance Smith chart on the output terminal side defining and functioning as the second ends.

Also in FIGS. 3 and 4, the solid lines indicate the results of the example of preferred embodiment. The broken lines indicate the results of the comparative example. FIG. 3 shows that both of the impedances of the example of a preferred embodiment and the comparative example are about 50Ω. In contrast, FIG. 4 shows that the impedance of the example of a preferred embodiment deviates from 50Ω, and is about 70Ω. FIG. 4 shows that the impedance of the comparative example is also about 50Ω.

As described above, the design parameters of the multiple serial arm resonators 101 to 107 and parallel arm resonators 201 to 207 are adjusted. Thus, the impedances of the stages of ladder circuit units may be easily adjusted. This enables the impedance on the input terminal 901 side, which is the first end, to be different from the impedance on the output terminal 902 side which is the second end. Therefore, the impedances on the input terminal 901 side and the output terminal 902 side are adjusted. Thus, the impedance difference from the impedance of a peripheral component that is to be connected may be reduced. Therefore, it was discovered that impedance matching may preferably be achieved by providing an impedance matching circuit disposed of the single inductor 301 or the single inductor 302.

The serial arm resonators 101 to 107 and the parallel arm resonators 201 to 207 are connected to one another as illustrated in FIG. 1. In the actual design of a ladder filter, many circuits include a configuration in which the capacitances of adjacent resonators are combined with each other.

Figure 5:
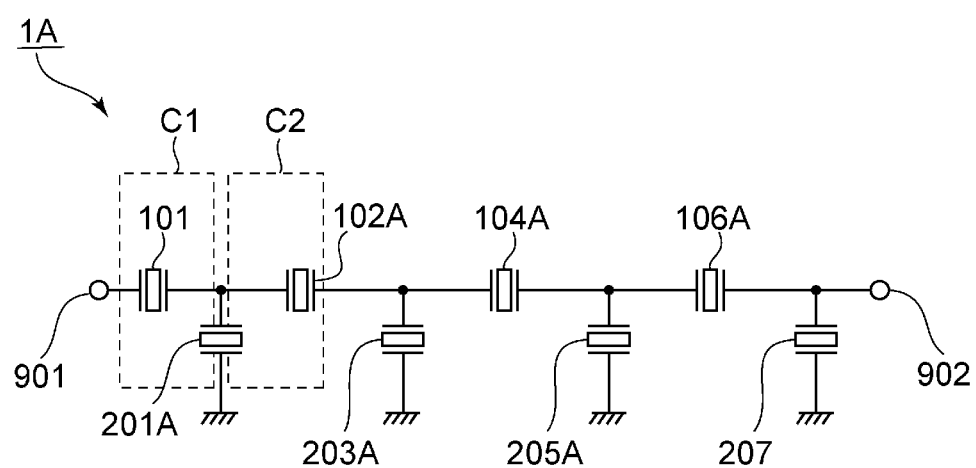
FIG. 5 is a diagram illustrating a circuit configuration obtained when adjacent resonators of adjacent ladder circuit units in the circuit diagram illustrated in FIG. 1 are combined in terms of a capacitance.

FIG. 5 is a diagram illustrating the circuit configuration obtained when, in the ladder filter 1 illustrated in FIG. 1, adjacent resonators of adjacent ladder circuit units are combined in terms of capacitance.

That is, as serial arm resonators in a ladder filter 1A illustrated in FIG. 5, the serial arm resonator 101, a serial arm resonator 102A, a serial arm resonator 104A, and a serial arm resonator 106A are disposed in this sequence from the input terminal 901 side to the output terminal 902 side. The parallel arm resonators 201A, 203A, and 205A, and the parallel arm resonator 207 are disposed. The capacitance of the serial arm resonator 102A corresponds to the combined capacitance of the serial arm resonator 102 and the serial arm resonator 103 in the ladder circuit units in FIG. 1. Therefore, if the electrostatic capacity of the serial arm resonator 102 is equal or substantially equal to that of the serial arm resonator 103, the capacitance of the serial arm resonator 102A is half or substantially half of the capacitance of the serial arm resonator 102 or the capacitance of the serial arm resonator 103.

In contrast, the capacitance of the parallel arm resonator 201A is the combined capacitance of the capacitance of the parallel arm resonator 201 and the capacitance of the parallel arm resonator 202 of the ladder filter in FIG. 1. Therefore, if the electrostatic capacity of the parallel arm resonator 201 is equal or substantially equal to the electrostatic capacity of the parallel arm resonator 202, the capacitance of the parallel arm resonator 201A is a double or substantially double the capacitance of the parallel arm resonator 201 or the capacitance of the parallel arm resonator 202.

The configuration of the ladder filter 1A corresponds to the configuration in which, in the ladder filter 1, adjacent serial arm resonators between stages, for example, the serial arm resonators 102 and 103, are combined to define the serial arm resonator 102A, and in which adjacent parallel arm resonators between stages, for example, the parallel arm resonators 201 and 202, are combined to define the parallel arm resonator 201A. Therefore, in FIG. 5, the parallel arm resonator 201A is shared between a first-stage ladder circuit unit C1 and a second-stage ladder circuit unit C2. Similarly, the serial arm resonator 102A is shared between the second-stage ladder circuit unit C2 and a third-stage ladder circuit unit. In this case, to make impedances different from one another between stages, the capacitance of the parallel arm resonator 201A and the capacitance of the serial arm resonator 102A may preferably be set to the combined capacitances obtained in accordance with the expressions described below.

The capacitance of serial arm resonator 102A=(the capacitance of serial arm resonator 102×the capacitance of serial arm resonator 103)/(the capacitance of serial arm resonator 102+the capacitance of serial arm resonator 103).

The capacitance of the parallel arm resonator 201A=(the capacitance of the parallel arm resonator 201+the capacitance of the parallel arm resonator 202).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ladder filter including a serial arm and a plurality of parallel arms, the serial arm connecting a first end to a second end, the plurality of parallel arms being connected between the serial arm and a ground potential, the ladder filter comprising:
   a plurality of serial arm resonators disposed along the serial arm; and
   a plurality of parallel arm resonators each disposed along a respective parallel arm of the plurality of parallel arms; wherein
   a plurality of ladder circuit units are disposed from the first end to the second end;
   each of the plurality of ladder circuit units includes a corresponding serial arm resonator of the plurality of serial arm resonators and a corresponding parallel arm resonator of the plurality of parallel arm resonators, and the plurality of ladder circuit units are mirror-connected to one another; and
   an impedance at the first end is different from an impedance at the second end.

2. The ladder filter according to claim 1, wherein
   in the plurality of ladder circuit units, when impedances of adjacent ladder circuit units are Xa and Xb, the adjacent ladder circuit units are mirror-connected to one another; and
   when the ladder circuit unit having the impedance Xa is positioned on the first end relative to the ladder circuit unit having the impedance Xb, Xa≤Xb or Xa≥Xb is satisfied, and not all impedances of all of the plurality of the ladder circuit units are equal or substantially equal to one another.

3. The ladder filter according to claim 1, wherein, when impedances of each of the plurality of ladder circuit units are Xa, Xb, Xc, . . . , Xn from the first end to the second end, Xa≤Xb≤Xc≤ . . . ≤Xn or Xa≥Xb≥Xc≥ . . . ≥Xn is satisfied, and Xa=Xb=Xc= . . . =Xn is not satisfied.

4. The ladder filter according to claim 1, further comprising an inductor connected between at least one of first and second ends and the ground potential.

5. The ladder filter according to claim 1, wherein the impedance at the first end or the second end is equal to or substantially equal to about 50Ω.

6. The ladder filter according to claim 1, wherein the plurality of serial arm resonators and the plurality of parallel arm resonators are defined by elastic wave resonators.

7. A ladder filter comprising:
   a serial arm connecting a first end to a second end;
   a plurality of parallel arms connected between the serial arm and a ground potential;
   a plurality of serial arm resonators disposed along the serial arm;
   a plurality of parallel arm resonators each disposed along a respective parallel arm of the plurality of parallel arms; wherein
   a plurality of ladder circuit units are disposed from the first end to the second end;
   each of the plurality of ladder circuit units includes a corresponding serial arm resonator of the plurality of serial arm resonators and a corresponding parallel arm resonator of the plurality of parallel arm resonators, the plurality of ladder circuit units being mirror-connected to one another, and
   a first impedance at the first end is different from a second impedance at the second end.

8. The ladder filter according to claim 7, wherein
   a first ladder circuit unit of the plurality of ladder circuit units has a first impedance Xa;
   a second ladder circuit unit of the plurality of ladder circuit units has a second impedance Xb;
   the first ladder circuit unit and the second ladder circuit unit are positioned adjacent to each other and are mirror-connected to one another;
   when the first ladder circuit unit is positioned closer to the first end than the second ladder circuit unit, Xa≤Xb or Xa≥Xb, is satisfied, and not all impedances of all of the plurality of the ladder circuit units are equal or substantially equal to one another.

9. The ladder filter according to claim 7, wherein, when impedances of each of the plurality of ladder circuit units are Xa, Xb, Xc, . . . , Xn from the first end to the second end, Xa≤Xb≤Xc≤ . . . ≤Xn or Xa≥Xb≥Xc≥ . . . ≥Xn is satisfied, and Xa=Xb=Xc= . . . =Xn is not satisfied.

10. The ladder filter according to claim 7, further comprising an inductor that is connected between at least one of the first and second ends and the ground potential.

11. The ladder filter according to claim 7, wherein the first impedance at the first end or the second impedance at the second end is equal to or substantially equal to about 50Ω.

12. The ladder filter according to claim 7, wherein the plurality of serial arm resonators and the plurality of parallel arm resonators are defined by elastic wave resonators.

13. A ladder filter comprising:
   a serial arm connecting a first end to a second end;
   a plurality of parallel arms connected between the serial arm and a ground potential; and a plurality of ladder circuit units each including a serial arm resonator and a parallel arm resonator; wherein the serial arm resonator is disposed on the serial arm, and the parallel arm resonator is disposed on one of the plurality of parallel arms;

adjacent units of the plurality of ladder circuit units are mirror-connected to one another;

impedances of each of the plurality of ladder circuit units sequentially increase or decrease in a direction from the first end to the second end.

14. The ladder filter according to claim 13, wherein at least one impedance of the impedances of each of the plurality of ladder circuit units is different from another impedance of the impedances of each of the plurality of ladder circuit units.

15. The ladder filter according to claim 13, further comprising an inductor connected between at least one of the first and second ends and the ground potential.

* * * * *